United States Patent
Nishiyama

(10) Patent No.: US 11,609,194 B2
(45) Date of Patent: Mar. 21, 2023

(54) NUCLEAR MAGNETIC RESONANCE MEASUREMENT APPARATUS AND METHOD

(71) Applicants: JEOL Ltd., Tokyo (JP); RIKEN, Wako (JP)

(72) Inventor: Yusuke Nishiyama, Tokyo (JP)

(73) Assignees: JEOL Ltd., Tokyo (JP); RIKEN, Wako (JP)

(*) Notice: Subject to any disclaimer, the term of this patent is extended or adjusted under 35 U.S.C. 154(b) by 139 days.

(21) Appl. No.: 17/117,454

(22) Filed: Dec. 10, 2020

(65) Prior Publication Data

US 2021/0181130 A1   Jun. 17, 2021

(30) Foreign Application Priority Data

Dec. 11, 2019  (JP) .............................. JP2019-223772

(51) Int. Cl.
*G01N 24/08* (2006.01)
*G01R 33/30* (2006.01)
*G01R 33/50* (2006.01)

(52) U.S. Cl.
CPC .............. *G01N 24/08* (2013.01); *G01R 33/30* (2013.01); *G01R 33/50* (2013.01)

(58) Field of Classification Search
None
See application file for complete search history.

(56) References Cited

U.S. PATENT DOCUMENTS

| 2008/0287774 A1 | 11/2008 | Katz-Brull |
| 2009/0088578 A1* | 4/2009 | Lascola ................. A61K 49/10 600/420 |
| 2012/0326717 A1 | 12/2012 | Weitekamp et al. |

FOREIGN PATENT DOCUMENTS

| EP | 1098024 A1 | 9/2001 |
| EP | 3502728 A1 * | 6/2019 ............. G01N 24/08 |
| JP | 2009514946 A | 4/2009 |
| JP | 2013092436 A | 5/2013 |

OTHER PUBLICATIONS

Office Action issued in JP2019223772 dated Nov. 30, 2021.
Product specification, L-Histidine Hydrochloride Monohydrate, FujiFilm Wako Pure Chemical Corporation Nov. 12, 2018; https://labchem/wako.fujifilm.com/jp/product/spec_08(well-known arts)0070.pdf?jeAttribute=J.
Amino-Acid Preparation for infant TPN, Prescription Medicine, Pleamin-P Injection Solution, Aug. 2011, pp. 2-32.
Extended European Search Report issued in EP20211328.8 dated May 10, 2021.

(Continued)

*Primary Examiner* — Douglas X Rodriguez
(74) *Attorney, Agent, or Firm* — The Webb Law Firm

(57) ABSTRACT

Nuclear spins of particular atoms (14N) which distinctively exist in a crystal of an active pharmaceutical ingredient is manipulated, so that an initial magnetization (modulated magnetization) is caused in nearby hydrogen atoms which exist near the particular atoms in the crystal. The initial magnetization of the nearby hydrogen atoms is spread to peripheral hydrogen atoms which exist at a periphery of the nearby hydrogen atoms in the crystal. A magnetization which is spread in the crystal is directly or indirectly observed.

7 Claims, 8 Drawing Sheets

(56) References Cited

OTHER PUBLICATIONS

Pandey and Nishiyama, Proton-detected 3D 14N/14N/1H isotropic shift correlation experiment mediated through 1H-1H RFDR mixing on a natural abundant sample under ultrafast MAS, Journal of Magnetic Resonance, 2015, vol. 258, pp. 96-101.

Hong et al., Selective detection of active pharmaceutical ingredients in tablet formulations using solid-state NMR spectroscopy, Solid State Nuclear Magnetic Resonance, 2020, vol. 106, pp. 1-9.

Geppi et al., Solid-State NMR Studies of Pharmaceutical Systems, Applied Spectroscopy Reviews, 2008, vol. 43, pp. 202-302.

\* cited by examiner

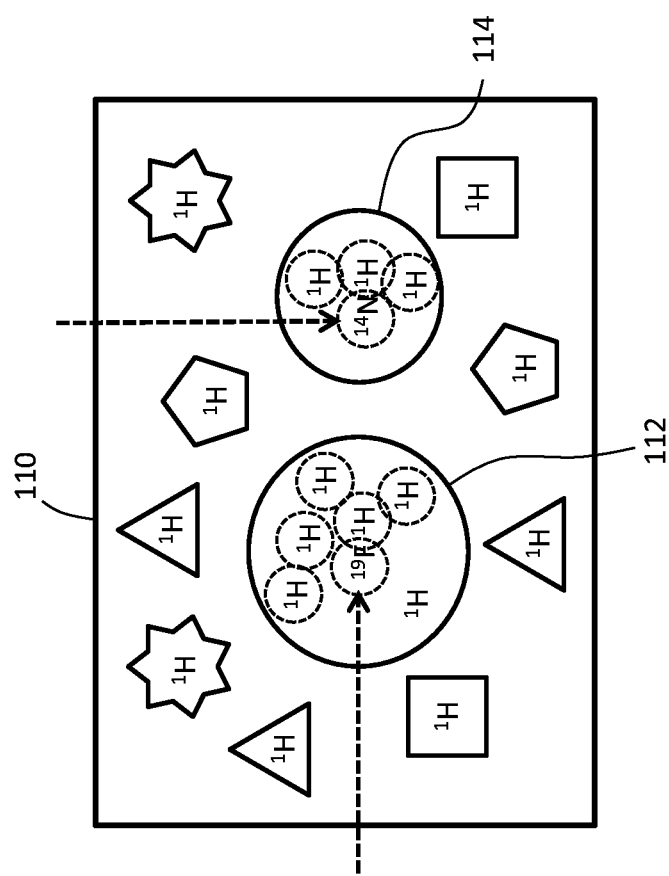

NUCLEAR MAGNETIC RESONANCE MEASUREMENT APPARATUS AND METHOD

CROSS REFERENCE TO RELATED APPLICATION

This application claims priority to Japanese Patent Application No. 2019-223772 filed Dec. 11, 2019, the disclosure of which is hereby incorporated by reference in its entirety.

BACKGROUND OF THE INVENTION

Field of the Invention

The present disclosure relates to a nuclear resonance measurement method and apparatus, and in particular to measurement of nuclear magnetic resonance caused in a solid sample.

Description of Related Art

A nuclear magnetic resonance (NMR) measurement apparatus is an apparatus in which an electromagnetic wave is irradiated onto a sample, and the NMR which is caused in the sample is observed, to produce an NMR spectrum. By analyzing the NMR spectrum, it becomes possible to identify a chemical structure of the sample or the like.

In cases in which a solid sample contains a crystal to be analyzed (crystal of interest) and other crystals (crystal(s) of non-interest), there is a demand for acquiring NMR information from the crystal of interest within being affected by the crystals of non-interest. For example, in a medical drug in a form of a powdered drug or a tablet, the crystal of interest is a crystal of an active pharmaceutical ingredient of the medical drug, and the crystals of non-interest are crystals of diluent components included in the medical drug. Normally, a medical drug contains a large number of diluent components. The above-described demand is more specifically a demand for acquiring only the NMR information from the crystal of the active pharmaceutical ingredient without being affected by the large number of diluent components. There is a similar demand for a particular domain in an amorphous material or for a particular domain in a polymer blend. However, in the related art, no technique which satisfies the demand has been realized.

JP 2013-92436 A discloses an NMR measurement method in which a signal due to a molecular species for which measurement is not desired may be removed or attenuated. However, this document does not disclose a technique which allows selection of a measurement target in units of particles such as crystals, domains, or the like (that is, solid elements).

An advantage of the present disclosure lies in realization of a technique for acquiring NMR information from a particle of interest without being affected by a particle of non-interest when a sample contains the particle of interest and the particle of non-interest. Alternatively, an advantage of the present disclosure lies in execution of the NMR measurement on an active pharmaceutical ingredient without being affected by a diluent component, for a medical drug which contains the active pharmaceutical ingredient and the diluent component.

SUMMARY OF THE INVENTION

According to one aspect of the present disclosure, there is provided a method of measuring a nuclear magnetic resonance, the method comprising: an initial step in which nuclear spins of particular atoms which distinctively exist in a particle of interest is manipulated, so that an initial magnetization is caused in nearby hydrogen atoms which exist near the particular atoms in the particle of interest; and an observing step in which, after the initial magnetization of the nearby hydrogen atoms is spread to peripheral hydrogen atoms which exist at a periphery of the nearby hydrogen atoms in the particle of interest, a magnetization which is spread in the particle of interest is directly or indirectly observed.

According to another aspect of the present disclosure, there is provided a nuclear magnetic resonance measurement apparatus comprising: a unit that manipulates nuclear spins of particular atoms which distinctively exist in a particle of interest in a solid sample by irradiating an electromagnetic wave onto the solid sample according to a sub pulse sequence for forming an initial state, so that an initial magnetization is caused in nearby hydrogen atoms which exist near the particular atoms in the particle of interest; and a unit that directly or indirectly observes, after the initial magnetization of the nearby hydrogen atoms is spread to peripheral hydrogen atoms which exist at a periphery of the nearby hydrogen atoms in the particle of interest, a magnetization which is spread in the particle of interest.

BRIEF DESCRIPTION OF THE DRAWINGS

Embodiment(s) of the present disclosure will be described based on the following figures, wherein:

FIG. 8 is a diagram showing a principle of an NMR measurement method according to another embodiment of the present disclosure.

DESCRIPTION OF THE INVENTION

Figure 1:
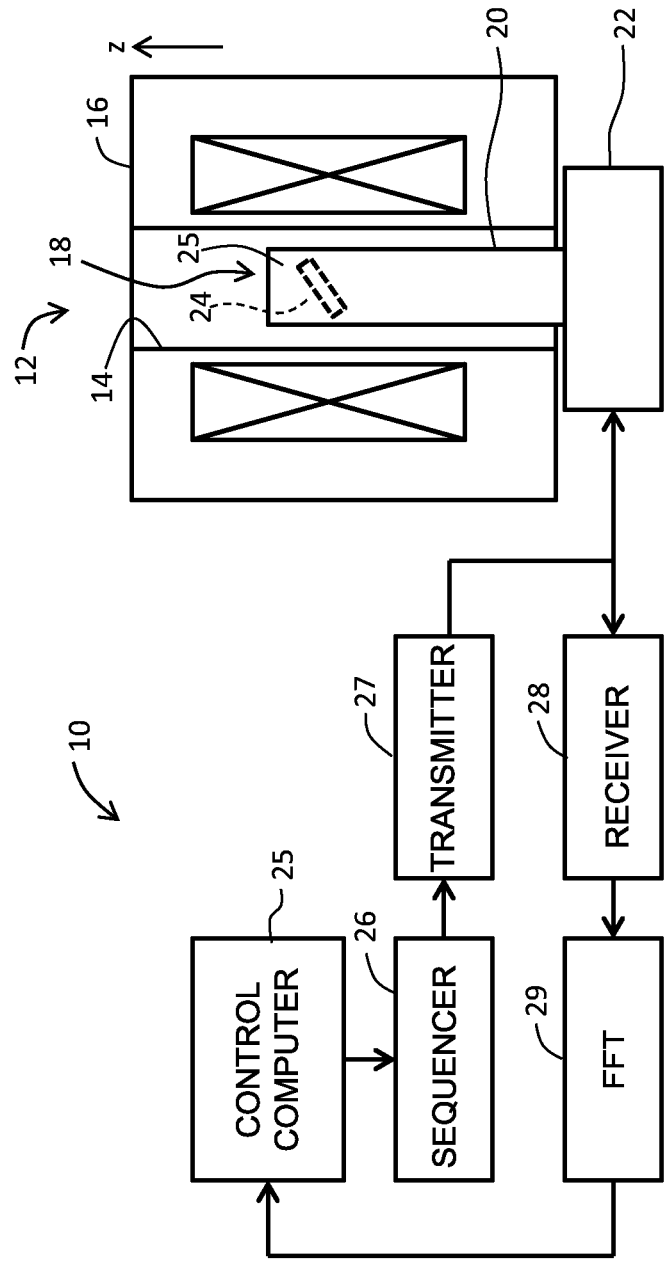
FIG. 1 is a diagram showing an example structure of an NMR measurement apparatus according to an embodiment of the present disclosure.

Embodiments of the present disclosure will now be described with reference to the drawings.

(1) Overview of Embodiment

A method of measuring a nuclear magnetic resonance according to an embodiment of the present disclosure comprises an initial step and an observing step. In the initial step, nuclear spins of particular atoms which distinctively exist in a particle of interest is manipulated, so that an initial magnetization is caused in nearby hydrogen atoms which exist near the particular atoms in the particle of interest. In the observing step, after the initial magnetization of the nearby hydrogen atoms is spread to peripheral hydrogen atoms which exist at a periphery of the nearby hydrogen atoms in the particle of interest, a magnetization which is spread in the particle of interest is directly or indirectly observed.

In the above-described method, NMR information from the particle of interest is selectively observed utilizing the facts that the particular atoms distinctively exist in the particle of interest and the spreading of the magnetization does not extend to outside of the particle.

More specifically, between nuclear spins of the particular atoms and nuclear spins of the nearby hydrogen atoms, there exist a direct interaction and an indirect interaction. By manipulating the nuclear spins of the particular atoms using irradiation of an electromagnetic wave, the nuclear spins of the nearby hydrogen atoms which interacts with the nuclear spins of the particular atoms can be changed. That is, a unique magnetization (initial magnetization) derived from the manipulation can be caused in the nearby hydrogen atoms. As will be described below, the initial magnetization is a modulated magnetization component, or a transferred magnetization component. From the viewpoint of a spreading source, the initial magnetization may also be called a seed magnetization, serving as the spreading source.

In the particle of interest, there exist a direct interaction and an indirect interaction between the nuclear spins of the hydrogen atoms. With these interactions, the initial magnetization caused in the nearby hydrogen atoms is spread to the peripheral hydrogen atoms. In other words, the nuclear spins of the hydrogen atoms is spread in the particle of interest. The spreading of the magnetization may occur naturally, but alternatively, the spreading of the magnetization can be accelerated through electromagnetic wave irradiation. The spreading of the magnetization basically extends only within the particle of interest, and does not extend to the outside of the particle of interest. This is because a distance between crystals is large, and, basically, the nuclear spins thus does not spread over crystals. As such, a unique magnetization derived from the manipulation is caused in all or a part of the hydrogen atoms in the particle of interest, and is directly or indirectly observed.

Even when particles other than the particle of interest (particles of non-interest) contain hydrogen atoms, the initial magnetization is not caused in the particles of non-interest, and, thus, the particles of non-interest are naturally removed from the measurement target. Even if the initial magnetization is caused in the particle of non-interest, the extent of the initial magnetization in the particle of non-interest is very small, and can be ignored in practice. The particular atoms are atoms other than the hydrogen atoms. The hydrogen atom is basically 1H. In the present disclosure, $1H = {}^1H$, and the like.

In an embodiment of the present disclosure, the initial magnetization is a magnetization which is modulated by the nuclear spins of the particular atoms. Specifically, in a state in which the nearby hydrogen atoms have a magnetization, with a manipulation of the nuclear spins of the particular atoms, the magnetization of the nearby hydrogen atoms changes. That is, a modulated magnetization component is caused. The modulated magnetization component becomes the spreading source and also an observation target.

In an embodiment of the present disclosure, the initial magnetization is a magnetization which is transferred from the particular atoms to the nearby hydrogen atoms. That is, the initial magnetization is a transferred magnetization component. Both the modulation of the magnetization and the transfer of magnetization are achieved by utilizing the interactions between atomic nuclei. Examples of the interaction include a dipole-dipole interaction, a spin-spin interaction (J-coupling), and the like. A polarization transfer is also a form of the interaction.

In an embodiment of the present disclosure, in the initial step, an electromagnetic wave is irradiated onto a solid sample which contains the particle of interest, according to a sub pulse sequence for causing the initial magnetization in the nearby hydrogen atoms by the nuclear spins of the particular atoms. Various known pulse sequences may be used as such a sub pulse sequence. A sub pulse sequence means a pulse sequence which is executed in each step. A plurality of sub pulse sequences corresponding to a series of a plurality of steps form a pulse sequence.

In an embodiment of the present disclosure, a spreading step is provided between the initial step and the observing step. The spreading step is a step in which an electromagnetic wave is irradiated onto a solid sample which contains the particle of interest, according to a sub pulse sequence for spreading the initial magnetization of the nearby hydrogen atoms to the peripheral hydrogen atoms in the particle of interest. In an embodiment of the present disclosure, the magnetization which is spread in the spreading step is a longitudinal magnetization or a transverse magnetization. When the longitudinal magnetization is to be spread, the electromagnetic wave is irradiated such that the longitudinal magnetization is caused in the nearby hydrogen atoms due to the nuclear spins of the particular atoms at a final stage of the initial step. When the transverse magnetization is to be spread, an electromagnetic wave is irradiated such that the transverse magnetization is caused in the nearby hydrogen atoms due to the nuclear spins of the particular atoms at a final stage of the initial step. As the sub pulse sequence for the spreading of the magnetization, various known pulse sequences may be used. When a container housing the solid sample is rotationally driven in an inclined state according to an MAS (Magic Angle Spinning) method, a recoupling technique which restores the interaction between 1H nuclear spins may be used.

In an embodiment of the present disclosure, in the observing step, relaxation of the magnetization which is spread in the particle of interest is observed. The observed magnetization is normally the transverse magnetization. When the spreading of the longitudinal magnetization is selected in the spreading step, at the start of the observing step, a pulse is irradiated onto the solid sample, which causes the transverse magnetization from the longitudinal magnetization. When the spreading of the transverse magnetization is selected in the spreading step, irradiation of such a pulse becomes unnecessary. The magnetization of the hydrogen atoms may be directly observed after the spreading, or, alternatively, the magnetization may be transferred from the hydrogen atoms to other atoms, and the magnetization after the transfer may be observed. That is, the magnetization of the hydrogen atoms may be indirectly observed.

In an embodiment of the present disclosure, the particle of interest is a crystal of an active pharmaceutical ingredient included in a medical drug. The crystal shape or the like of the active pharmaceutical ingredient may be analyzed based on the NMR information acquired from the crystal. Normally, a medical drug also contains diluents, but according to the above-described method, mixing of the NMR information from the diluents can be prevented. The spreading of the magnetization basically does not extend to the outside of the crystal. The above-described method takes advantage of this property, to form a state in which only the hydrogen atoms in the crystal have the unique magnetization. Alternatively, the magnetization may be spread in a particular domain in an amorphous material. Alternatively, the magnetization may be spread in a particular domain in a polymer blend. In these cases, the particular domain serves as the particle of interest. The above-described method may also be executed even when the MAS method is not applied.

A nuclear magnetic resonance measurement apparatus according to an embodiment of the present disclosure comprises an initial state former, and a spread magnetization observer. The initial state former manipulates nuclear spins of particular atoms which distinctively exist in a particle of interest in a solid sample by irradiating an electromagnetic wave onto the solid sample, according to a sub pulse sequence for forming an initial state, so that an initial magnetization is caused in nearby hydrogen atoms which exist near the particular atoms in the particle of interest. The spread magnetization observer directly or indirectly observes, after the initial magnetization of the nearby hydrogen atoms is spread to peripheral hydrogen atoms which exist at a periphery of the nearby hydrogen atoms in the particle of interest, a magnetization which is spread in the particle of interest. Alternatively, there may be provided a magnetization spreader which accelerates the spreading of the magnetization by irradiating an electromagnetic wave onto the solid sample.

The initial state former described above corresponds to a controller, a sequencer, a transmitter, and an NMR probe. The spread magnetization observer described above corresponds to the controller, the sequencer, a receiver, and the NMR probe. The magnetization spreader corresponds to the controller, the sequencer, the transmitter, and the NMR probe. The controller includes a processor which operates according to a program. Similarly, the sequencer includes a processor which produces each pulse sequence under control of the controller. The initial state former described above includes one or more processors, the spread magnetization observer described above includes one or more processors, and the magnetization spreader described above includes one or more processors. These processors may be formed as the same physical processor, or as separate physical processors.

A nuclear magnetic resonance measurement apparatus according to an embodiment of the present disclosure includes a spinning mechanism which spins a container which houses a solid sample, while inclining the container. In a state in which the container is spinning, the magnetization is caused in nearby hydrogen atoms, and the magnetization which is spread in the particle of interest is observed.

(2) Details of Embodiment

FIG. 1 shows an example configuration of an NMR measurement apparatus according to an embodiment of the present disclosure. The illustrated NMR measurement apparatus is an apparatus which executes an NMR measurement method according to an embodiment of the present disclosure. More specifically the method is a method for selectively acquiring an NMR signal from crystals of an active pharmaceutical ingredient (API) included in a tablet which is a medical drug. Each crystal of the active pharmaceutical ingredient may also be called a particle of interest. Crystals of diluents included in the tablet may also be called particles of non-interest. Each particle is a solid element.

In FIG. 1, the NMR measurement apparatus has a spectrometer 10. The spectrometer 10 has a control computer 25. The control computer 25 is formed from a personal computer, a dedicated computer, or other information processors. The control computer 25 produces a pulse sequence program (instruction sequence) for executing a plurality of steps described below. The pulse sequence program is program which defines the pulse sequence, and an actual pulse sequence is produced by interpreting the pulse sequence program. Alternatively, a user may directly describe or designate the pulse sequence. The control computer 25 includes a processor which functions as a calculating unit and a controlling unit.

A sequencer 26 produces a pulse sequence according to the pulse sequence program. Specifically, the sequencer 26 controls an operation of a transmitter 27 such that a transmission signal (transmission pulse train) according to the pulse sequence is produced. The pulse sequence corresponds to a connected structure of a plurality of sub pulse sequences corresponding to the plurality of steps. The sequencer 26 includes a processor. In the illustrated example configuration, the sequencer 26 also controls an operation of a receiver 28. The transmitter 27 is an electronic circuit having a signal generator circuit, a signal adder, a power amplifier, or the like. The transmission signal is sent to an NMR probe 18. The transmitter 27 and the receiver 28 function as a transmission and reception unit.

A measurer 12 has a static magnetic field generator 16 and the NMR probe 18. The NMR probe 18 functions as a primary portion of the observer, and is formed from an insertion unit 20 and a base 22. The insertion unit 20 is inserted into a bore 14 formed in the static magnetic field generator 16. The base 22 is provided at a lower end of the insertion unit 20. A tip portion of the insertion unit 20 forms a probe head, and a spinning mechanism (spinner) 25 which rotationally drives a sample tube 24 is provided in the probe head. The spinning mechanism 25 rotationally drives the sample tube 24 while inclining the sample tube 24 at a predetermined angle (magic angle) with respect to the static magnetic field direction (z direction).

The NMR probe 18 irradiates an RF (radio frequency) wave to the sample based on the transmission signal, and detects an NMR signal (FID (free induction decay) signal) from the sample and outputs a reception signal. An electronic circuit is provided in the NMR probe 18 for these purposes. The electronic circuit includes a detection coil, a capacitor for tuning, a capacitor for matching, etc. In the sample tube 24, a solid sample to which predetermined processes are applied (more specifically, a pharmaceutical drug processed into a powder form) is housed.

The receiver 28 is an electronic circuit which includes a wave detector, an A/D converter, or the like. A digital reception signal which is output from the receiver 28 is sent to an FFT circuit 29. The FFT circuit 29 applies an FFT calculation to the FID signal, to produce an NMR spectrum. Based on the NMR spectrum, a quantitative analysis, a structural analysis, or the like with respect to the solid sample may be performed. Alternatively, the analysis of the NMR spectrum may be executed by the control computer 25. With the analysis of the NMR spectrum, a crystal form, a crystal structure, or the like of the crystal of the active pharmaceutical ingredient may be identified.

Figure 2:
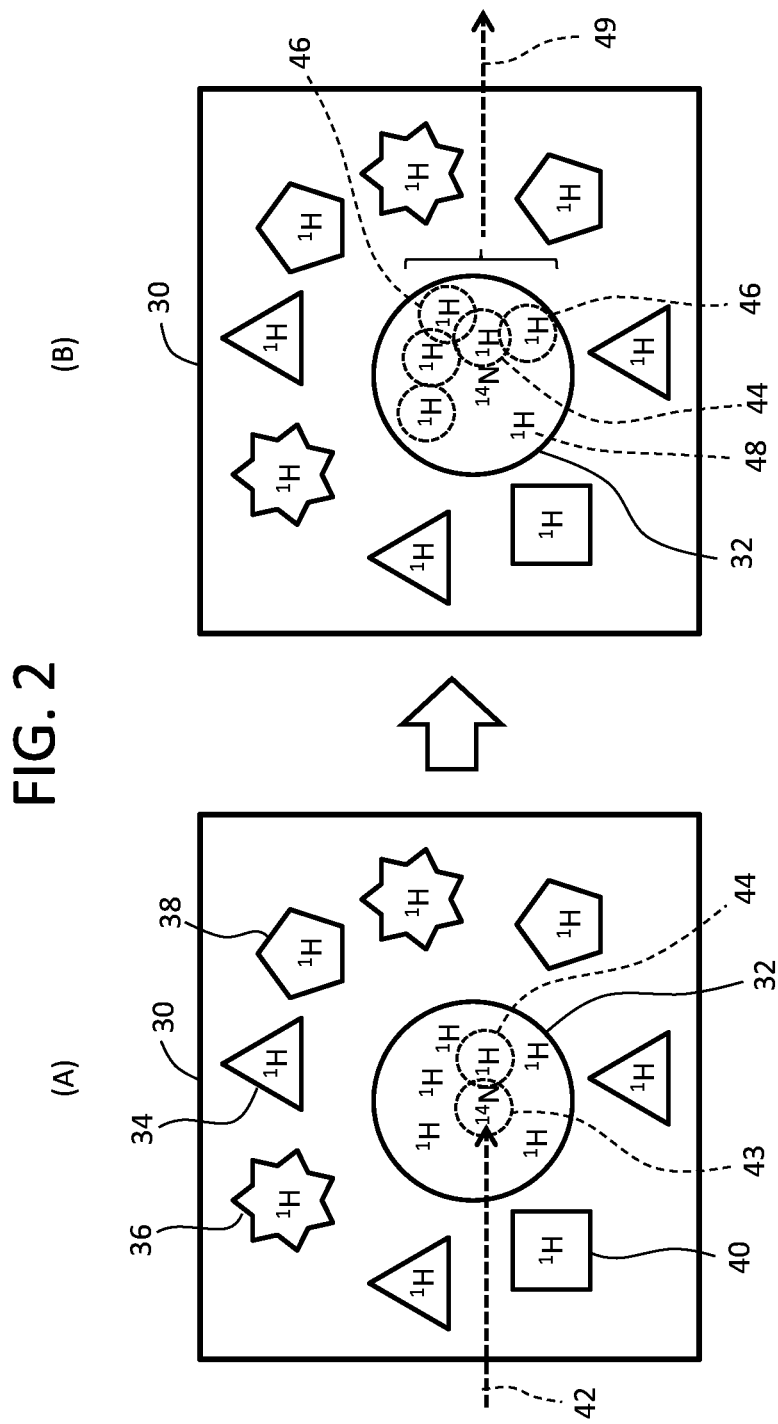
FIG. 2 is a diagram showing a principle of an NMR measurement method according to an embodiment of the present disclosure.

FIG. 2 shows a principle of the NMR measurement method according to the present embodiment, as a conceptual diagram. A pharmaceutical drug 30 in an initial state is shown in (A). The pharmaceutical drug 30 in a spread state is shown in (B). In the example illustrated in the figure, the pharmaceutical drug 30 includes a crystal of an active pharmaceutical ingredient 32, and various diluents 34~40. The diluents 34~40 also normally exist as crystals. In the active pharmaceutical ingredient crystal 32, 14Ns and 1Hs are contained. Here, the 14Ns distinctively or singularly exist in the active pharmaceutical ingredient crystal 32 (refer to reference numeral 43). That is, the 14Ns are not contained in the diluent 34~40. The 1Hs are contained in both the active pharmaceutical ingredient crystal 32 and the diluents 34~40. In FIG. 2, one 14N is shown in the crystal 32, but in reality, a large number of 14Ns exist in the crystal 32. Similarly, a large number of 1Hs exist in the crystal 32.

In the present embodiment, when the initial state is formed, an electromagnetic wave is irradiated (refer to reference numeral 42) onto the pharmaceutical drug 30 so that nuclear spins of the 14Ns (refer to reference numeral 43) are manipulated, and a predetermined initial magnetization (a magnetization component derived from the manipulation of the nuclear spins) is caused in nearby 1Hs directly bonded to the 14Ns in the crystal 32 (refer to reference numeral 44) (and the magnetization component is not caused in the 1Hs in the diluents 34~40).

As a first method for this purpose, there may be employed a method in which the magnetization of the nearby 1Hs is modulated by the nuclear spins of the 14Ns. In this case, a signal component due to the magnetization component caused by the modulation is to be observed. Other signal components are cancelled in a signal processing step (more specifically, in an accumulating step). As a second method of causing the magnetization only in the nearby 1Hs, there may be employed a method in which the magnetization of the 14Ns is transferred to the nearby 1Hs. In this case, a signal component due to the transferred magnetization component is to be observed.

After the initial state is formed, as shown in (B) in FIG. 2, a process is executed to spread the initial magnetization of the nearby 1Hs in the crystal 32. In this case, a natural spreading of the nuclear spins may be utilized, or an electromagnetic wave may be irradiated onto the pharmaceutical drug 30 according to a sub pulse sequence for spreading the spins, to accelerate the spreading of the nuclear spins. With the initial magnetization of the nearby 1Hs (refer to reference numeral 44) as a starting point, peripheral 1Hs (refer to reference numeral 46) acquire the initial magnetization. In the example configuration shown in the figure, the initial magnetization is spread over almost the entirety of the crystal 32. Alternatively, a certain portion of 1Hs (refer to reference numeral 48) may exist, which do not have the initial magnetization. The spreading of magnetization basically occurs only in the crystal 32, and does not extend to an outside of the crystal 32. This is because a distance between crystals is large, and the nuclear spins basically does not spread between crystals.

Even if 1Hs in other crystals exist near 14Ns of a certain crystal and the magnetization is caused in the 1Hs due to the change of the nuclear spins of the 14Ns, an extent of occurrence of such a magnetization is very small as a whole, and may thus be ignored. In FIG. 2, one crystal 32 is shown, but in reality, the magnetization spreading occurs in the crystals 32 in the pharmaceutical drug 30.

Then, as shown by reference numeral 49, relaxation of the magnetization which is spread is directly or indirectly observed. In this case, the relaxation of the magnetization of 1Hs in the crystal 32 may be observed, or the magnetization may be transferred to other atoms, and the relaxation of the transferred magnetization may be observed. Alternatively, the transferred magnetization may be again transferred to the 1Hs, and the relaxation of the magnetization after the transfer may be observed.

According to the NMR measurement method of the present embodiment, it is possible to set only the active pharmaceutical ingredient crystals 32 as the observation target, without being affected by the diluents 34~40 included in the pharmaceutical drug. Thus, a chemical structure or the like of the crystal 32 may be precisely analyzed. Alternatively, a similar method may be applied for crystals contained in an industrial material. Alternatively, a similar method may be applied to a particular domain in an amorphous material or to a particular domain in a polymer blend. As particular atoms serving as magnetization modulation atoms or magnetization transfer atoms, there may be exemplified, in addition to 14N, 15N, 19F, 33S, 35Cl, 37Cl, 79Br, 81Br, and the like.

Next, with reference to FIGS. 3 and 4, example configurations will be described. The active pharmaceutical ingredient which is the observation target is specifically L-cysteine. The particle of interest is a crystal of L-cysteine, and the nuclear spins to be manipulated for modulating the magnetization is the nuclear spins of 14Ns. The 14Ns are contained only in L-cysteine, and not in the diluents (in FIG. 3, 14N is expressed as an atom Y).

Figure 3:
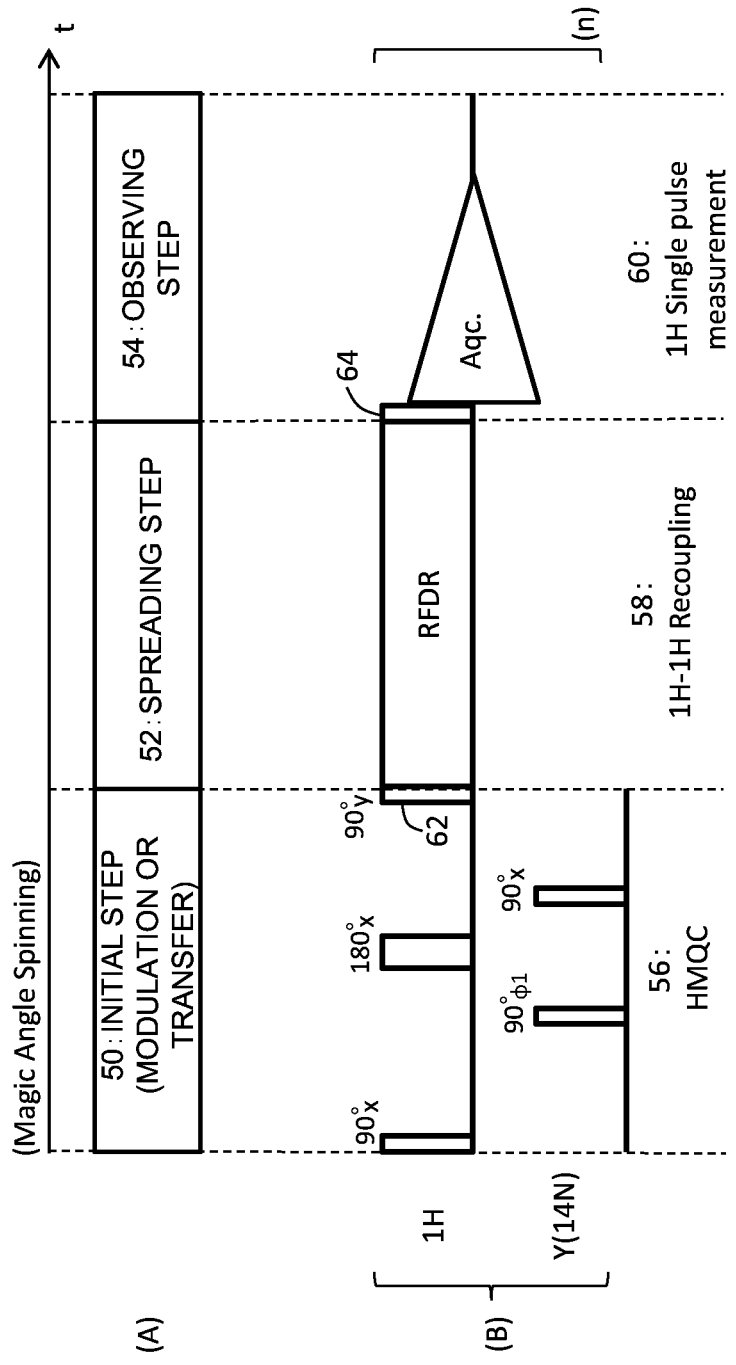
FIG. 3 is a diagram showing an example of an NMR measurement method according to an embodiment of the present disclosure.

In FIG. 3, (A) shows three steps of the NMR measurement method of the example configuration. The three steps include an initial step (modulation or transfer step) 50, a spreading step 52, and an observing step 54. Each step is automatically executed by the NMR measurement apparatus. The pharmaceutical drug is housed in a container, and the container is continuously rotationally driven according to the MAS method.

In FIG. 3, (B) shows a pulse sequence. The pulse sequence includes three sub pulse sequences corresponding to the three steps. An upper part of the pulse sequence shows a pulse train which acts on the 1Hs (including a reception process). A lower part of the pulse sequence shows a pulse train which acts on the 14Ns. In order to extract the modulated magnetization component, the pulse sequence is repeatedly executed n times while varying a part of conditions. Then, n reception signals acquired in n measurements are accumulated.

In the example configuration of FIG. 3, in the initial step 50, an electromagnetic wave is irradiated onto the pharmaceutical drug which is a solid sample according to a sub pulse sequence conforming to HMQC (Heteronuclear Multiple Quantum Correlation). Of the magnetizations caused in 1Hs in the pharmaceutical drug, the magnetization of 1Hs near 14Ns is modulated by the nuclear spins of the 14Ns. For example, irradiations of a plurality of times are executed while varying a phase of a 90-degree pulse ($\varphi$1), and a plurality of reception signals acquired by the plurality of irradiations are accumulated, so that only the modulated magnetization component can be extracted.

When spreading of a longitudinal magnetization is to be executed in the following step, the spreading step 52, the longitudinal magnetization is left as the modulated magnetization component at the end of the initial step 50. In this case, a 90-degree pulse 62 is irradiated. On the other hand, when spreading of a transverse magnetization is to be executed in the spreading step 52, the transverse magnetization is left as the modulated magnetization component at the end of the initial step 50. In this case, the irradiation of the 90-degree pulse 62 is unnecessary. In the initial step 50, various methods may be employed. Examples of variations of these methods will be described later with reference to FIG. 5.

The spreading step 52 is a step in which the magnetization of the nearby 1Hs in the crystal is spread in the crystal. In the example illustrated in the figure, a method of causing a 1H-1H recoupling (RFDR: Radio-Frequency Driven Recoupling) is executed. In this method, a predetermined pulse is irradiated when a spinning angle of the container is within a predetermined range, so as to restore the 1H-1H coupling which disappeared in the MAS method. Examples of variations of the magnetization spreading method will be described later with reference to FIG. 6. The spreading of the magnetization occurs only in the individual crystal.

In the observing step 54, relaxation of the magnetization of the 1Hs in the crystal is directly or indirectly observed. In the example illustrated in the figure, a 90-degree pulse (single pulse) is used to observe the relaxation of the magnetization. Examples of variations of the observation method will be described later with reference to FIG. 7. As described above, a plurality of NMR reception signals acquired while varying the phase of the predetermined pulse are accumulated.

Figure 4:
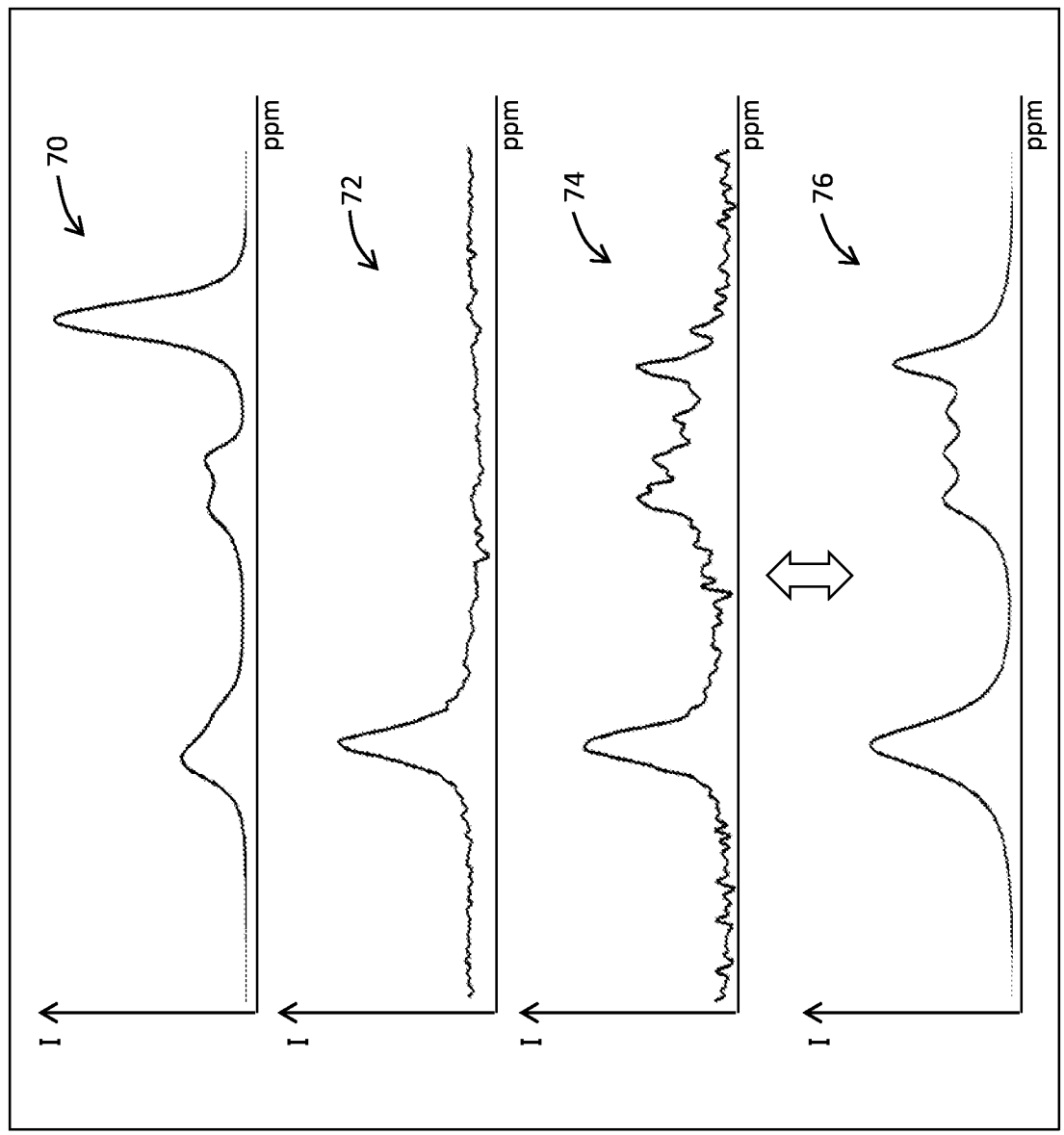
FIG. 4 is a diagram showing a result of execution of an NMR measurement method according to an embodiment of the present disclosure.

FIG. 4 shows a result of execution of the example configuration. An uppermost part of FIG. 4 shows an NMR spectrum 70 produced by observing the magnetization of the 1Hs over the entire pharmaceutical drug. The NMR spectrum 70 includes a signal component from the active pharmaceutical ingredient and signal components from the diluents, and distinguishing and extracting only the former signal component is very difficult. At an upper middle part of FIG. 4, there is shown an NMR spectrum 72 which is produced by observing the magnetization of the 1Hs near (directly bonded to) the 14Ns. The NMR spectrum 72 is derived from the active pharmaceutical ingredient, but because the spreading step is not yet applied, the signal component corresponding to the active pharmaceutical ingredient is weak.

At a lower middle part of FIG. 4, an NMR spectrum 74 produced by the method of the example configuration is shown. Signals from a large number of 1Hs included in the active pharmaceutical ingredient crystal are observed. At a lower part of FIG. 4, there is shown an NMR spectrum 76 which is observed by an ordinary method and with only the active pharmaceutical component as a measurement target. The NMR spectrum 74 according to the example configuration has a form close to the NMR spectrum 76. This is evidence of the effectiveness of the method of the present example configuration.

Figure 5:
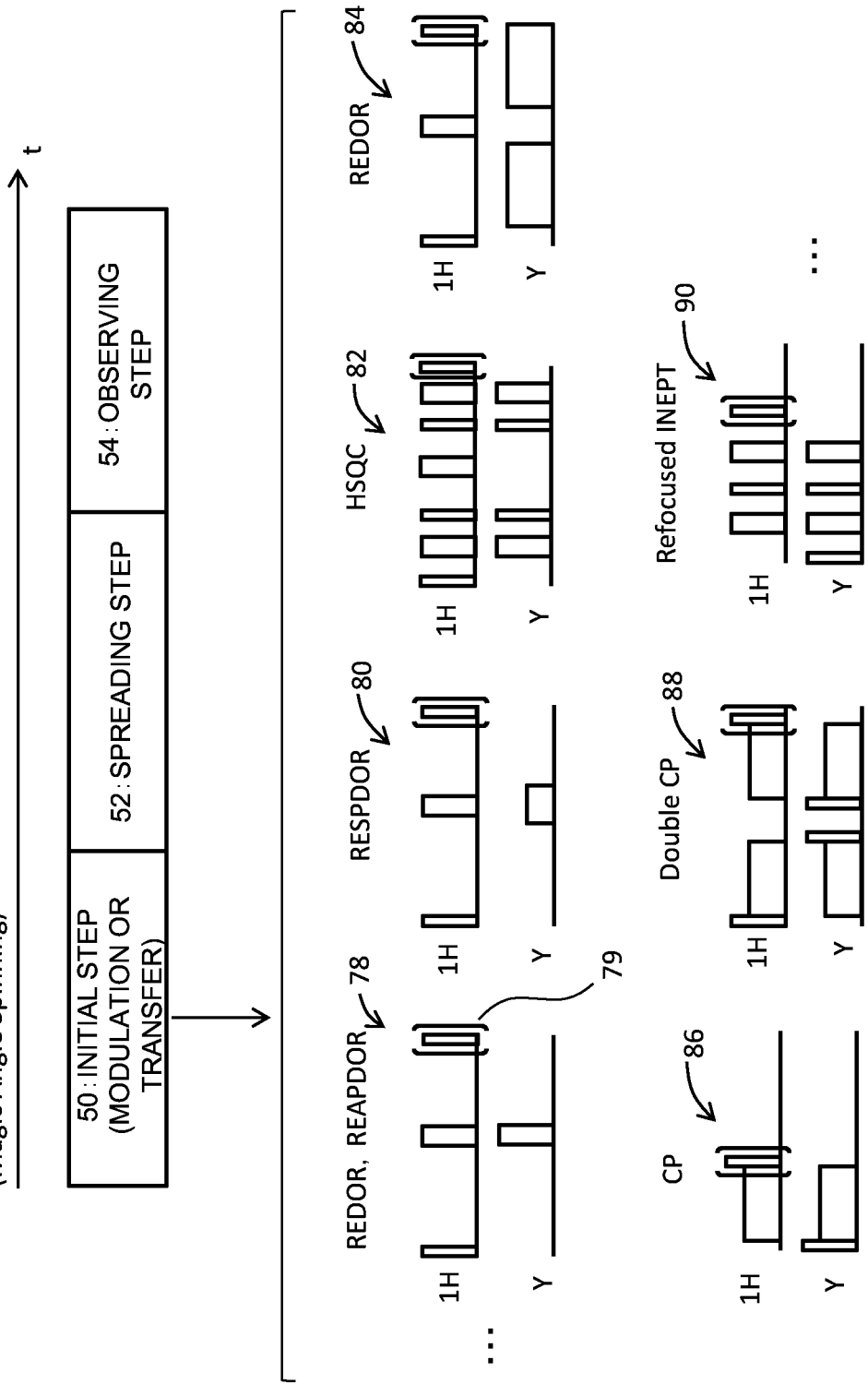
FIG. 5 is a diagram showing variations of a method of modulating magnetization or of transferring magnetization.

FIG. 5 exemplifies variations of the initial step 50. As shown by reference numeral 78, a REDOR (Rotational Echo DOuble Resonance) method or a REAPDOR (Rotational Echo Adiabatic Passage DOuble Resonance) method may be used to produce the modulated magnetization component in the 1Hs directly bonded to the 14Ns. In this case, a pulse sequence of n times is executed while switching between presence and absence of an inverted pulse. Reference numeral 79 shows a 90-degree pulse. When the spreading of the transverse magnetization is to be executed, the 90-degree pulse 79 is irradiated. This is also similarly applicable in other sub pulse sequences to be described below.

In order to produce the modulated magnetization component in the 1Hs directly bonded to the 14Ns, a RESPDOR (Resonance Echo Saturation Pulse DOuble Resonance) method may be employed, as shown by reference numeral 80. In this method, presence and absence of a saturated pulse are switched. Alternatively, an HSQC (Heteronuclear Single Quantum Correlation) method may be used, as shown by reference numeral 82. In this method, a phase of the pulse is changed. Alternatively, presence and absence of a recoupling pulse may be switched in the REDOR, as shown by reference numeral 84.

Alternatively, transfer of the magnetization may be executed based on a CP (Cross Polarization) method, as shown by reference numeral 86. Alternatively, the transfer of the magnetization may be executed based on a Double CP method, as shown by reference numeral 88. Further alternatively, the transfer of the magnetization may be executed by a Refocused INEPT (Insensitive Nuclei Enhanced by Polarization Transfer) method, as shown by reference numeral 90. The sub pulse sequences shown in FIG. 5 are merely exemplary.

Figure 6:
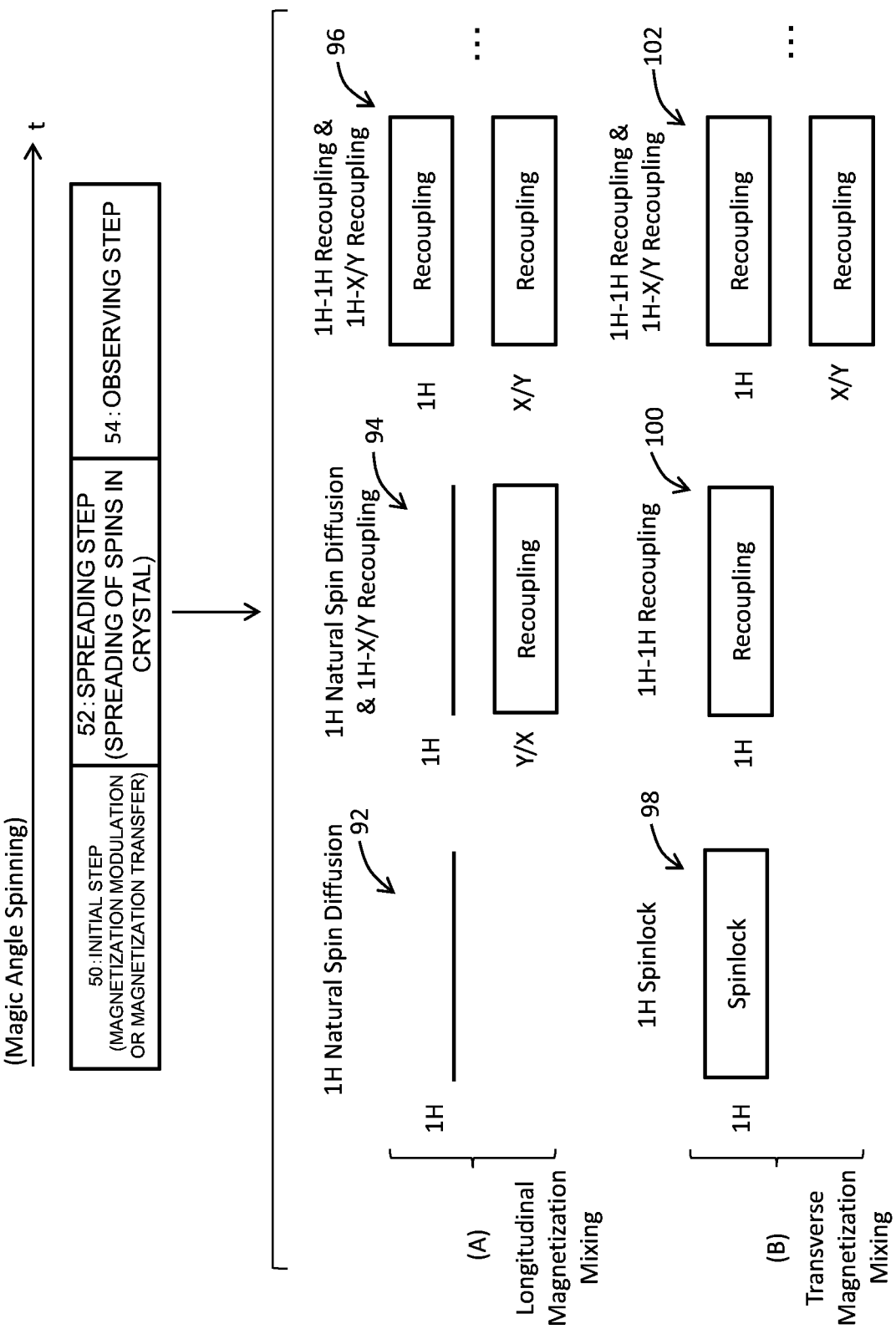
FIG. 6 is a diagram showing variations of a spin spreading method.

FIG. 6 exemplifies variations of the spreading step 52. A mixing method of the longitudinal magnetization is shown in (A), and a mixing method of the transverse magnetization is shown in (B).

With regard to the mixing of the longitudinal magnetization, a natural magnetization spreading may be allowed to occur without irradiating any pulse, as shown by reference numeral 92. This method is a time-consuming method, but a purer magnetization spreading can be expected. Alternatively, while allowing the natural magnetization spreading to occur between 1H-1H, the recoupling may be caused between 1H and X or Y, as shown by reference numeral 94. Here, X is an atom other than the 14Ns and 1Hs. Alternatively, at the same time as causing the recoupling between 1H-1H, the recoupling may be caused between 1H and X or Y, as shown by reference numeral 96. The recoupling is restoration of the coupling which has disappeared in the MAS method. Thus, the method prevents time-averaging of the coupling under the MAS method. As an example of this method, the above-described RFDR may be exemplified.

With regard to the mixing of the transverse magnetization, a spinlock method may be applied to the 1Hs as shown by reference numeral 98. Alternatively, the recoupling may be caused between 1H-1H, as shown by reference numeral 100. Further alternatively, at the same time as the recoupling caused between 1H-1H, the recoupling may be caused between the 1H and X or Y, as shown by reference numeral 102. The variations shown in FIG. 6 are merely exemplary.

Figure 7:
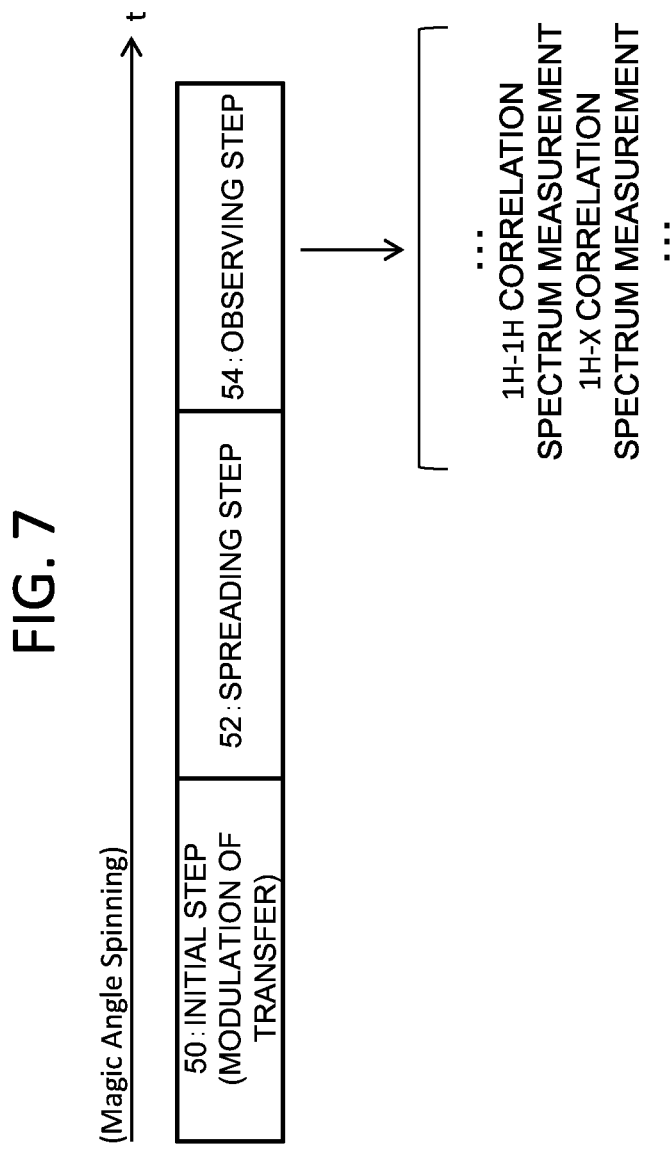
FIG. 7 is a diagram showing variations of an observation method.

FIG. 7 exemplifies variations of the observing step 54. The relaxation of the magnetization of the 1Hs may be measured using the single pulse as described above, but alternatively, the magnetization of the 1Hs may be transferred to X or Y, and the relaxation of the magnetization after the transfer may be measured. Another configuration may be considered in which the transferred magnetization is returned to the 1Hs, and the relaxation of the returned magnetization is measured. Alternatively, a 1H/1H correlation spectrum measurement, a 1H/X correlation spectrum measurement, or the like may be executed. When the X or the Y is included as a spreading target of the magnetization in the spreading step, the magnetization caused in X or Y may be measured in the observing step without any further processing. In this case, the spreading step functions as a preparatory step for the observing step. The variations shown in FIG. 7 are merely exemplary.

FIG. 8 shows a measurement method according to another embodiment of the present disclosure. A pharmaceutical drug 110 includes a crystal of a first active pharmaceutical ingredient 112 and a crystal of a second active pharmaceutical ingredient 114. In addition, the pharmaceutical drug 110 contains crystals of a plurality of diluents. The crystal 112 includes 19F and 1H, and the crystal 114 includes 14N and 1H. The diluents include the 1Hs, but do not include the 19Fs or the 14Ns. That is, the crystal 112 distinctively includes the 19Fs and the crystal 114 distinctively includes the 14Ns.

The method as already described may be applied individually to each of the crystals 112 and 114, to individually acquire the NMR information from the crystals 112 and 114. In this manner, the crystal forms or the like of the crystals 112 and 114 may be individually identified.

The invention claimed is:

1. A method of measuring a nuclear magnetic resonance, the method comprising:
   an initial step in which nuclear spins of particular atoms which distinctively exist in particles of interest are manipulated, so that an initial magnetization is caused in nearby hydrogen atoms which exist near the particular atoms in the particles of interest, the particles of interest forming a crystal of an active pharmaceutical ingredient included in a medical drug; and
   an observing step in which, after the initial magnetization of the nearby hydrogen atoms is spread to peripheral hydrogen atoms which exist at a periphery of the nearby hydrogen atoms in the particles of interest, a magnetization which is spread in the particles of interest is directly or indirectly observed,
   wherein the medical drug comprises the particles of interest forming the crystals of the active pharmaceutical ingredient and particles of non-interest forming a crystal of a diluent, and
   wherein the particular atoms exist in the particles of interest and the particular atoms are absent from the particles of non-interest.

2. The method of measuring the nuclear magnetic resonance according to claim 1, wherein
   the initial magnetization is a magnetization which is modulated by the nuclear spins of the particular atoms.

3. The method of measuring the nuclear magnetic resonance according to claim 1, wherein
   the initial magnetization is a magnetization which is transferred from the particular atoms to the nearby hydrogen atoms.

4. The method of measuring the nuclear magnetic resonance according to claim 1, wherein
   in the initial step, an electromagnetic wave is irradiated onto a solid sample which contains the particle of interest, according to a sub pulse sequence for causing a magnetization in the nearby hydrogen atoms by the nuclear spins of the particular atoms.

5. The method of measuring the nuclear magnetic resonance according to claim 1, further comprising:
   a spreading step in which an electromagnetic wave is irradiated onto a solid sample which contains the particle of interest, according to a sub pulse sequence for spreading the initial magnetization of the nearby hydrogen atoms to the peripheral hydrogen atoms in the particle of interest.

6. A nuclear magnetic resonance measurement apparatus comprising:
   a unit that manipulates nuclear spins of particular atoms which distinctively exist in particles of interest in a solid sample by irradiating an electromagnetic wave onto the solid sample, according to a sub pulse sequence for forming an initial state, so that an initial magnetization is caused in nearby hydrogen atoms which exist near the particular atoms in the particles of interest, the particles of interest forming a crystal of an active pharmaceutical ingredient included in a medical drug; and
   a unit that directly or indirectly observes, after the predetermined magnetization of the nearby hydrogen atoms is spread to peripheral hydrogen atoms which exist at a periphery of the nearby hydrogen atoms in the particles of interest, a magnetization which is spread in the particles of interest,
   wherein the medical drug comprises the particles of interest forming the crystals of the active pharmaceutical ingredient and particles of non-interest forming a crystal of a diluent, and
   wherein the particular atoms exist in the particles of interest and the particular atoms are absent from the particles of non-interest.

7. The nuclear magnetic resonance measurement apparatus according to claim 6, further comprising:
   a spinning mechanism which spins a container which houses the solid sample, while inclining the container, wherein
   in a state in which the container is spinning, the initial magnetization is caused in the nearby hydrogen atoms, and the magnetization which is spread in the particle of interest is observed.

* * * * *